United States Patent [19]
Gwozdz et al.

[11] Patent Number: 4,622,738
[45] Date of Patent: Nov. 18, 1986

[54] METHOD OF MAKING INTEGRATED BIPOLAR SEMICONDUCTOR DEVICE BY FIRST FORMING JUNCTION ISOLATION REGIONS AND RECESSED OXIDE ISOLATION REGIONS WITHOUT BIRDS BEAK

[75] Inventors: Peter S. Gwozdz, Cupertino; Christopher O. Schmidt, Sunnyvale; William L. Price, Saratoga, all of Calif.

[73] Assignee: Advanced Micro Devices, Inc., Sunnyvale, Calif.

[21] Appl. No.: 720,824

[22] Filed: Apr. 8, 1985

[51] Int. Cl.$^4$ ................ H01L 21/265; H01L 21/225
[52] U.S. Cl. ........................ 29/576 B; 29/576 W; 29/578; 148/1.5; 148/187; 148/DIG. 10; 357/34; 357/91
[58] Field of Search ............ 29/576 B, 578, 576 W; 148/1.5, 187; 357/34, 91

[56] References Cited

U.S. PATENT DOCUMENTS

| | | | |
|---|---|---|---|
| 4,199,378 | 4/1980 | van Gils | 148/1.5 |
| 4,261,763 | 4/1981 | Kumar et al. | 148/1.5 |
| 4,376,664 | 3/1983 | Hataishi et al. | 148/175 |
| 4,441,932 | 4/1984 | Akasaka et al. | 148/1.5 |
| 4,452,645 | 6/1984 | Chu et al. | 29/576 B |
| 4,472,459 | 9/1984 | Fisher | 29/576 W |
| 4,525,922 | 7/1985 | Kiriseko | 29/577 C |
| 4,535,531 | 8/1985 | Bhatia et al. | 29/576 W |

OTHER PUBLICATIONS

Hui et al, IEEE Trans. Electron Devices, ED-29 (1982), 554.
Downing et al, Electronics, 57, (Jun. 1984), p. 131.

*Primary Examiner*—Upendra Roy
*Attorney, Agent, or Firm*—J. Vincent Tortolano; Patrick T. King

[57] ABSTRACT

A method is presented for fabricating a bipolar semiconductor device utilizing a combination of junction isolation, oxide isolation, stepper lithography and plasma etching to produce an integrated circuit device having reduced device sizes and increased performance. The method includes the steps of removing portions of a masking layer to expose surface areas of an epitaxial layer, where first type isolation regions are then formed; then forming second type isolation regions in the epitaxial layer, and forming base, emitter and collector contact regions, also in the epitaxial layer; and forming conductive lines on the base, emitter and collector contact regions.

20 Claims, 7 Drawing Figures

METHOD OF MAKING INTEGRATED BIPOLAR SEMICONDUCTOR DEVICE BY FIRST FORMING JUNCTION ISOLATION REGIONS AND RECESSED OXIDE ISOLATION REGIONS WITHOUT BIRDS BEAK

BACKGROUND OF THE INVENTION

1. FIELD OF THE INVENTION

This invention relates to integrated circuit structures and in particular, to a method for fabricating multiple isolation regions in such structures resulting in devices having high yield due to less defects and improved device topography.

2. DESCRIPTION OF THE PRIOR ART

Numerous techniques are known for providing electrical isolation of discrete devices in an integrated circuit structure. Junction isolation and oxide isolation are two such techniques. The two primary goals of these isolation methods have been to reduce the size of the isolation regions in proportion to the total area of silicon available for formation of active devices and to decrease the size of the active devices. However, certain known disadvantages are related to the use of either junction isolation or oxide isolation in manufacturing integrated circuits. It is recognized, for example, that the use of diffused regions for junction isolation results in larger, less well defined circuits than desired for many applications. The use of junction isolation, therefore, has been largely replaced by the use of oxide isolation techniques.

Oxide isolation, however, also suffers from certain known disadvantages (see, e.g. VORA et al., U.S. Pat. No. 4,374,011), including a problem known as "birds beak" or encroachment, in which regions of oxidized semiconductor material will slope into adjoining regions of semiconductor material. Encroachment is undesirable because it uses additional amounts of the surface of the integrated circuit structure. Furthermore, oxidized semiconductor material formed using conventional techniques protrudes upwards from the surface of the surrounding material. The non-planar upper surface which results can cause problems with subsequently formed conducting or insulating layers which could have a propensity to crack where they cross the upward projections. In addition, excess stresses resulting from long oxidation periods can cause dislocation defects which seriously affect production yield.

A further disadvantage is that the fullest capabilities of state-of-the-art processing techniques cannot be utilized in fabricating devices employing conventional isolation methods. The use of diffused junction isolation, for example, limits the feature size and density benefits that can be gained from stepper lithography and plasma etching processing techniques. In this case, the isolation method itself defines a minimum feature size which is larger than the feature size that is otherwise achievable with stepper lithography and plasma etching.

The aforementioned disadvantages become increasingly troublesome as integrated circuit device geometries are reduced for Very Large Scale Integration (VLSI) applications. It would be desirable, therefore, to develop a method for fabricating integrated circuits employing device isolation methods which overcome the planarity and scaling limitation problems of conventional prior art fabrication techniques and which allow the maximum shrinking of device geometries through the use of state-of-the-art processing techniques.

SUMMARY OF THE INVENTION

It is therefore an object of the present invention to provide a method for fabricating integrated circuits having reduced device geometries and increased speed.

It is another object of the present invention to provide a method for fabricating integrated circuits which employs selected oxide growth and etching techniques to enhance surface planarity so as to reduce device defects, thus allowing fabrication of integrated circuits having reduced device sizes, yet high manufacturing yield.

It is a further object of the present invention to provide a method for fabricating integrated circuits which utilizes a combination of junction isolation, oxide isolation, stepper lithography and plasma etching to produce an integrated circuit having reduced device sizes and increased performance.

It is still another object of the present invention to provide a method for fabricating integrated circuits using ion implantation techniques to produce integrated circuits having tighter beta tolerances, and thus tighter speed specifications.

An advantage of the present invention is that integrated circuits having reduced device sizes can be produced by a fabrication method which eases manufacturing constraints related to lithographic processing steps.

A further advantage of the present invention is that the fabrication method used allows for the addition of further technological improvements extending the process lifetime.

In accordance with the present invention a method is provided for fabricating integrated circuits utilizing junction isolation and oxide isolation techniques, in combination with stepper lithography and plasma etching technology, to produce integrated circuits having reduced device sizes, yet increased performance and high yield. The above objects and advantages of the present invention are achieved by a method for fabricating a bipolar semiconductor device having a silicon substrate of a first conductivity type, a first active region of a second conductivity type formed in the substrate, and a second conductivity type epitaxial layer formed over the substrate and the first active region. The device also has a buffer layer formed over the epitaxial layer and a masking layer formed over the buffer layer. The first active region functions as a buried collector region of the bipolar semiconductor device.

Specifically, the method of the present invention for fabricating a bipolar semiconductor device comprises first selectively removing portions of the masking layer using stepper lithography, so as to leave selected portions of the masking layer overlying at least one first region and at least one second region of the buffer layer, and such that the masking layer has a plurality of apertures which expose a plurality of surface areas of the buffer layer.

Next, a plurality of isolation regions of a first type are formed in the exposed surface areas of the buffer layer. The first type isolation regions are formed of insulating material which is different from the material which comprises the masking layer but which may be the same as the material comprising the buffer layer. The masking layer prevents first type isolation regions from being formed on any portions of the epitaxial layer other than on portions underlying the previously exposed surface areas of the buffer layer.

In accordance with the preferred embodiment of the present invention, after the first type isolation regions are formed, a second active region is formed in the epitaxial layer. The second active region functions as a sinker region of the bipolar semiconductor device.

After the sinker region is formed, first portions of the masking layer and first portions of the buffer layer are removed to expose the aforementioned plurality of first epitaxial regions. Second type isolation regions of a first conductivity type are then formed in the exposed first epitaxial regions. The second type isolation regions are formed in such a manner that they extend from the upper surface of the epitaxial layer to a depth greater than the depth of the epitaxial layer, and such that at least one of the second type isolation regions defines the periphery of an island of the epitaxial layer. This island of the epitaxial layer includes the second epitaxial region or regions which remain covered by the masking and buffer layers at this stage of the fabrication process.

Following the formation of the second type isolation regions, a third active region is formed in the second epitaxial region within the island of the epitaxial layer defined by a previously formed second type isolation region. This third active region functions as a base region of the bipolar semiconductor device.

Next, a fourth active region and fifth active region are simultaneously formed in the second epitaxial region within the aforementioned island of the epitaxial layer. The fourth active region functions as an emitter region and the fifth active region functions as a collector contact region of the bipolar semiconductor device.

The fabrication method of the present invention is completed by selectively applying conductive material to the third, fourth and fifth active regions. Stepper lithography and anisotropic plasma etching techniques are utilized to selectively apply the conductive material such that conductive lines are formed on the base emitter and collector contact regions.

The foregoing and other objects, features and advantages of the invention will be apparent from the following detailed description of the preferred embodiments of the invention when read in conjunction with the accompanying drawings, with like reference numerals representing corresponding parts throughout.

BRIEF DESCRIPTION OF THE DRAWINGS

FIGS. 1-7 are cross-sections showing a process sequence of a method for fabricating a bipolar semiconductor device, and in which particularly:

DETAILED DESCRIPTION OF THE PRESENT INVENTION

Reference is now made in detail to a specific embodiment of the present invention, which illustrates the best mode presently contemplated by the inventors for practicing the invention, the preferred embodiment of which is set forth in the accompanying drawings. The drawings referred to in this description are understood to be not drawn to scale and to illustrate only one portion of an integrated circuit fabricated in accordance with the present invention.

Figure 1:
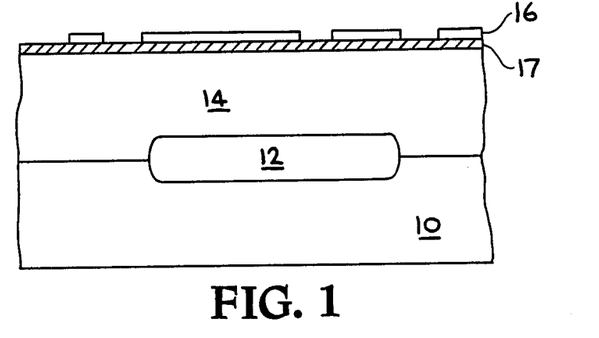
FIG. 1 is a cross-section showing a masking layer and a buffer layer on an epitaxial layer formed over a buried first active region in a semiconductor substrate.

FIG. 1 shows a semiconductor device in process, having a semiconductor substrate 10, a first active region 12 formed in the substrate 10 and an epitaxial layer 14 formed over both the substrate 10 and the first active region 12. In accordance with the method of the present invention, the semiconductor substrate 10 is comprised of silicon of a first conductivity type. The first active region 12 and the epitaxial layer 14 are comprised of material of a second conductivity type. The first active region 12 operates as a buried collector region of the semiconductor device and can be formed in a conventional manner by introducing second conductivity type impurities into the first conductivity type substrate 10. The epitaxial layer 14 can be formed using conventional vapor-phase epitaxy techniques.

As shown in FIG. 1, the semiconductor device in process includes a masking layer 16 formed over a buffer layer 17 on the epitaxial layer 14. In accordance with the present invention, the masking layer 16 is comprised of silicon nitride and the buffer layer is comprised of thermal silicon dioxide. According, then, to the method of the present invention, portions of the masking layer 16 are selectively removed to create apertures in the masking layer 16, which apertures expose selected portions of the buffer layer 17. The apertures in the masking layer 16 are formed by masking a layer of photoresist material (not shown) formed over the masking layer 16. The layer of photoresist material is applied using a conventional technique such as spinning or spraying onto the masking layer a chemical formulation containing a light sensitive material.

Figure 6:
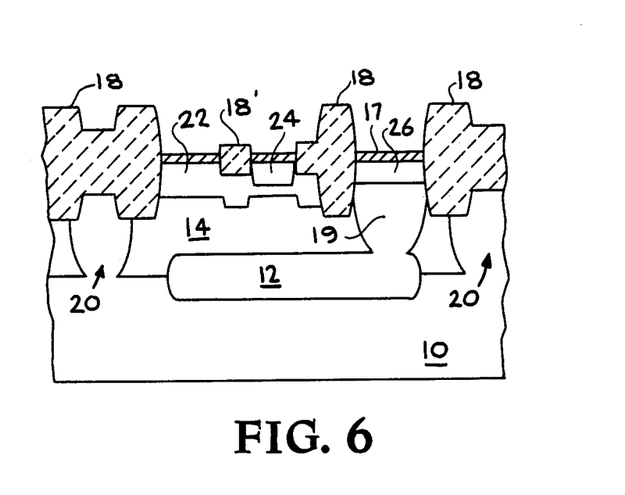
FIG. 6 is a cross-section showing FIG. 5 after a fourth active region and a fifth active region have been simultaneously formed in selected regions of the epitaxial layer.

In accordance with the preferred embodiment of the present invention, a positive resist material is used on all photoresist layers. Positive resists degrade and become more easy to remove upon being exposed, and hence the exposed portion of the resist is removed when the resist is developed. Thus, with a positive resist, the lithographic step of exposing the resist defines an image of the selected portion(s) of the underlying layers to be affected by later processing steps (e.g., etching, introduction of impurities, etc.). The use of a positive photoresist material is preferred because these photoresists do not suffer from the solvent-induced swelling problems characteristic of negative photoresists. During development of a negative photoresist, the developing solvent causes swelling of the negative photoresist which rethe region 24 is formed such that it extends to a depth less than the depth of the base region 22. The fourth active region 24 functions as an emitter region of the semiconductor device. As shown in FIG. 6, and in accordance with the preferred embodiment of the present invention, the oxide isolation region 18' islates the upper surface of the emitter region 24 from the upper surface of the base region 22.

The fifth active region 26 is formed in the sinker region 19 using ion implantation to introduce dopant ions of a second conductivity type into a portion of the sinker region 19. The fifth active region 26 is formed such that it extends to a depth less then the depth of the epitaxial layer 14, and to a depth approximately equal to the depth of the emitter region 24. The fifth active region 26 functions as a collector contact region of the semiconductor device. As shown in FIG. 6, the oxide isolation region 18 isolates the upper surface of the collector contact region 26 from the upper surface of the emitter region 24.

Next, the device is annealed to remove implant damage. The anneal time and temperature may be chosen to diffuse the base and emitter regions to the desired final profile. In the preferred embodiment of the present invention, portions of the buffer layer 17 still protect the contact surfaces at this point. The remainder of the buffer layer 17, therefore, is next etched away.

Figure 7:
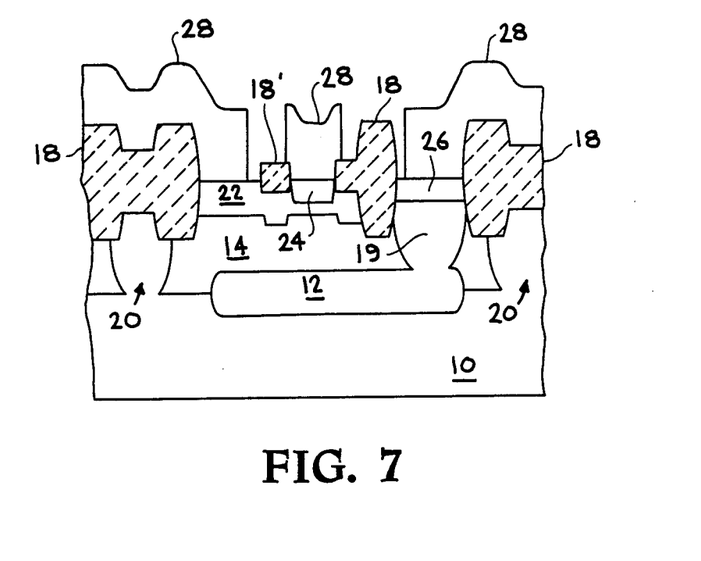
FIG. 7 is a cross-section showing FIG. 6 after conductive lines have been formed on the second, third and fourth active regions.

Conductive material is next applied to the upper surfaces of the device. Conductive lines 28, shown in FIG. 7, are then formed by masking the conductive material using stepper lithography, and then using anisotropic plasma (dry) etching techniques to remove portions of the conductive material, thereby forming the conductive lines 28.

In accordance with the preferred embodiment of the present invention, the first conductivity type impurity which forms the substrate 10, the junction isolation region 20 and the base region 22 is a p conductivity type impurity. The second conductivity type impurity which forms the buried collector region 12, the epitaxial layer 14, the sinker region 19, the emitter region 24 and the collector contact region 26 is an n conductivity type impurity. The buried collector, base, emitter and collector contact regions 12, 22, 24, 26 together form a bipolar NPN transistor.

Also in accordance with the preferred embodiment of the present invention, the conductive lines 28 are comprised of conductive material deposited in accordance with conventional techniques. The conductive lines 28 operate to electrically couple the base, emitter and collector contact regions 22, 24, 26 to the rest of the integrated circuit of which the bipolar transistor is a part.

The foregoing description of the preferred embodiment of the present invention has been presented for purposes of illustration and description. It is not intended to be exhaustive or to limit the invention to the precise form disclosed, and obviously many modifications and variations are possible in light of the above teaching. The embodiment was chosen and described in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto and their equivalents.

What is claimed is:

1. A method for fabricating a bipolar semiconductor device, said bipolar semiconductor device having a silicon substrate of a first conductivity type, a first active region of a second conductivity type formed in said silicon substrate of a first conductivity type, and an epitaxial layer of a second conductivity type formed over said silicon substrate and over said first active region, said bipolar semiconductor device also having a buffer layer formed over said epitaxial layer and a masking layer formed over said buffer layer, wherein said first active region functions as a buried collector region of said bipolar semiconductor device, said method comprising the steps of:

optically exposing portions of a layer of photoresist material formed over said masking layer, wherein said optically exposing is accomplished using stepper lithography to define within said photoresist layer images for a plurality of surface areas of said epitaxial layer, and such that portions of said masking layer not optically exposed define at least one first region and at least one second region of said epitaxial layer;

exposing said plurality of surface areas of said epitaxial layer by removing portions of said masking layer underlying said portions of said photoresist layer which were optically exposed, wherein said removing is accomplished by selectively plasma etching said masking and buffer layers;

forming a plurality of isolation regions of a first type in said selected portions of said epitaxial layer, such that each said exposed area of said buffer layer is incorporated into one of said first type isolation regions, and wherein said masking layer prevents said isolation regions from being formed on any portions of said epitaxial layer other than on said selected portions of said epitaxial layer, said first type isolation regions being formed of insulating material different from material comprising said masking layer, and being formed of the same material comprising said buffer layer;

removing portions of said masking layer and said buffer layer overlying all of said first epitaxial regions;

forming second type isolation regions in all of said first epitaxial regions said second type isolation regions being of said first conductivity type and extending from the upper surface of said epitaxial layer to a depth greater than the depth of said epitaxial layer, wherein at least one of said second type isolation regions defines the periphery of an island of said epitaxial layer, which island includes said at least one second epitaxial region;

forming a second active region in said at least one second epitaxial region within said island of said epitaxial layer, wherein said second active region functions as a base region of said bipolar semiconductor device;

simultaneously forming a third active region and a fourth active region in said at least one second epitaxial region within said island of said epitaxial layer, wherein said third active region functions as an emitter region of said bipolar semiconductor device, and said fourth active region functions as a collector contact region of said bipolar semiconductor device;

removing remaining portions of said buffer layer;

depositing a layer of conductive material over said semiconductor device;

sults in ragged edges or a loss of pattern fidelity that makes these photoresists less suited for resolving elements under 2 micrometers (micron or μm) and hence less suited for VLSI applications. Positive photoresists, on the other hand, can readily define elements as small as 0.5 μm in size. They can also be used in much thicker coatings than negative photoresists. As a result, positive photoresists are more resistant to chemical etches, and hence more reliable with respect to potential problems like improper step coverage and pinhole formation.

Referring again to the fabrication method of the present invention, after the photoresist layer is applied, it is then optically exposed to define within the photoresist layer images of a plurality of surface areas of the buffer layer 17 and the epitaxial layer 14 where field oxide isolation regions are to be formed. In accordance with the present invention, stepper lithographic equipment is used to align and expose photoresist layers employed in the fabrication process. Stepper lithography allows the use of smaller feature sizes than more traditional masking technologies. Smaller feature sizes are possible because stepper machines, by exposing wafers one or a few die at a time, allow a smaller field of exposure which produces better resolution. Additionally, misalignment problems are less severe because no more than a few die are aligned at one time, whereas traditional methods align an entire wafer simultaneously.

After the photoresist layer has been exposed, it is developed in a conventional manner thereby opening up the photoresist layer to allow etching of the underlying masking layer. The masking layer is then etched to create apertures which expose selected surface area portions of the underlying buffer layer 17 and epitaxial layer 14. At this time, the exposed surface area portions of the buffer layer 17 may be etched away; in the preferred embodiment, however, the buffer layer 17 is not removed at this step of the process.

Figure 2:
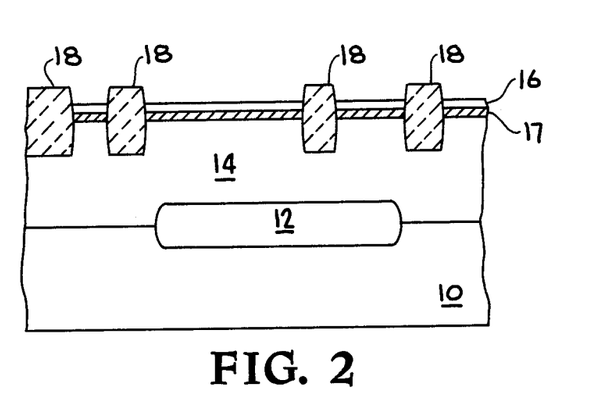
FIG. 2 is a cross-section showing FIG. 1 after a plurality of first type isolation regions have been formed in selected areas of the epitaxial layer which were previously exposed by selectively removing portions of the masking layer.

Next, as shown in FIG. 2, a plurality of first type isolation regions 18 are formed in the previously exposed portions of the epitaxial layer 14. In accordance with the preferred embodiment of the present invention, the first type isolation regions 18 are comprised of silicon dioxide formed by thermally oxidizing the portions of the epitaxial layer 14 under the apertures previously created in the masking layer 16.

Figure 3:
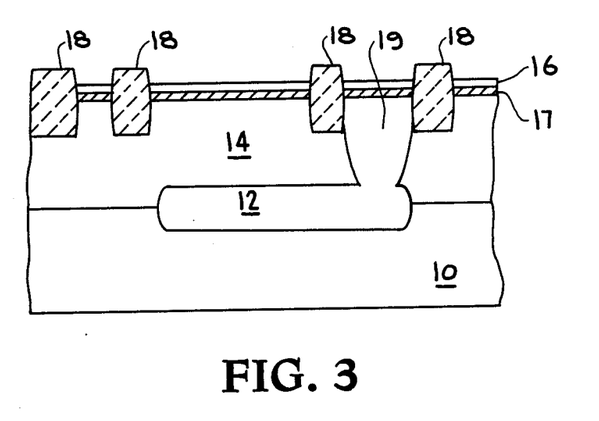
FIG. 3 is a cross-section showing FIG. 2 after a second active sinker region has been formed in a portion of the epitaxial layer.

Referring now to FIG. 3, in accordance with the preferred embodiment of the present invention, after the oxide isolation regions 18 are formed, a second active region 19 is formed in the epitaxial layer 14. The second active region 19 functions as a sinker region of the bipolar semiconductor device and is formed by introducing impurities of a second conductivity type through the masking and buffer layers 16, 17 into the epitaxial layer 14, such that the sinker region 19 intersects the buried collector region 12. The sinker region 19 operates to reduce the collector series resistance due to the vertical path between the buried collector region 12 and the collector-contact region to be formed later. According to the method of the present invention, the sinker region 19 is formed by implanting second conductivity type dopant ions into the epitaxial layer 14. Photoresist can be used to protect other portions of the epitaxial layer 14; since the oxide isolation regions 18 define the aperture for the sinker region 19, stepper lithography is convenient, but not required for creating the sinker region 19.

Figure 4:
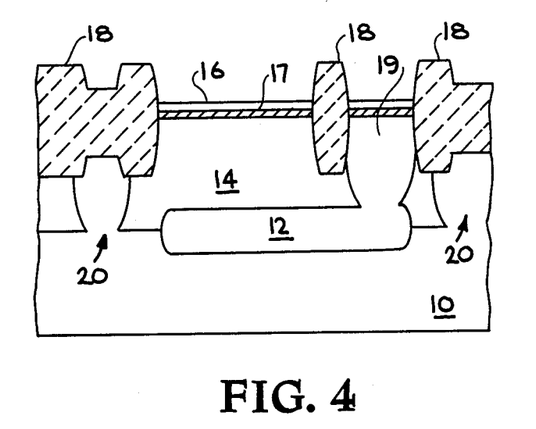
FIG. 4 is a cross-section showing FIG. 3 after at least one second type isolation region has been selectively formed in epitaxial regions between selected first type isolation regions.

After the sinker region 19 is formed, portions of the masking and buffer layers 16, 17 are removed by etching these regions and layers to expose selected regions of the epitaxial layer 14. Here again, stepper lithography is convenient but not required. Then, as shown in FIG. 4, a second type isolation region 20 is formed in the exposed regions of the epitaxial layer 14. The second type isolation region 20 (shown in cross-section in two separate areas of the epitaxial layer 14) is formed by introducing impurities of the first conductivity type into the epitaxial layer 14, such that the second type isolation region 20 extends to a depth greater than the depth of the epitaxial layer 14. The second type isolation region 20 extends into the substrate 10, and thus functions as a junction isolation region of the semiconductor device. In accordance with the prsent invention, the depth of the junction isolation region 20 is in the range of 1 to 5 microns. The exposed upper surface portions of the semiconductor device are then reoxidized, thus reforming the oxide isolation regions 18, as shown in FIG. 4.

Next, a photoresist layer (not shown) is formed over the semiconductor device, using stepper lithography. Using the photoresist layer as a mask, first portions of the masking layer 16 and the buffer layer 17 are then removed to define selected regions of the epitaxial layer 14. First portions of a third active region are next formed by introducing impurities of a first conductivity type through the masking layer apertures into the selected regions of the epitaxial layer 14. The first conductivity type impurities are introduced, for example, by conventional diffusion or ion implantation techniques.

Figure 5:
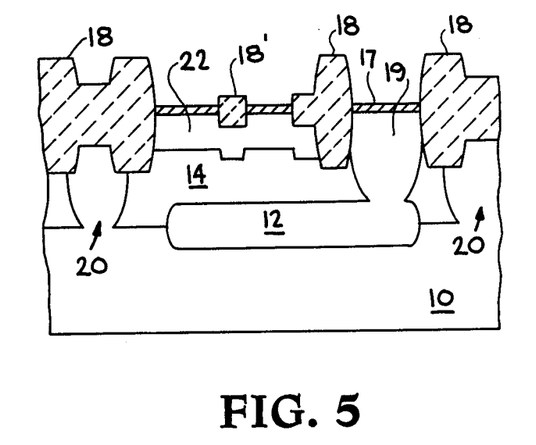
FIG. 5 is a cross-section showing FIG. 4 after a third active region has been formed in a selected region of the epitaxial layer, after which an additional first type isolation region is formed, and a previously formed first type isolation region is reformed.

Referring now to FIG. 5, the exposed surface of the epitaxial layer 14 is reoxidized to form oxide isolation region 18'. Additionally, one of the earlier formed oxide isolation regions 18 is oxidized further when the epitaxial layer 14 is reoxidized. In accordance with the present invention the thickness of the oxide isolation regions 18 is in the range of 6,000 to 10,000 Angstroms.

Next, the masking layer 16 is completely removed to expose remaining regions of the buffer layer 17. Second and third portions of the third active region are then formed by introducing impurities of a first conductivity type into selected areas of the third active region in the epitaxial layer 14. According to the preferred embodiment of the present invention, the first conductivity type impurities are introduced into the epitaxial layer 14 using photoresist masking and two ion implantation steps, thereby completing the formation of the third active region 22, as shown in FIG. 5. The third active region 22 is formed such that it extends into the epitaxial layer 14 to a depth less than the depth of the epitaxial layer 14. The third active region 22 functions as a base region of the semiconductor device. One of the two ion implantations referred to above is deep and functions as the active base (below the region 24 in FIG. 6). The other ion implantation is shallow and serves to reduce contact resistance at the base contact (See FIG. 7 and corresponding text below). The previously formed first portion of the third active region serves as the extrinsic base (connecting the base contact to the active base).

Referring now to FIG. 6, a fourth active region 24 and a fifth active region 26 are next simultaneously formed. In accordance with the preferred embodiment of the present invention, the fourth active region 24 is formed within the base region 22 using ion implantation and photoresist masking to introduce dopant ions of a second conductivity type into a portion of the base region 22. The periphery of the fourth active region 24 is defined by the oxide isolation regions 18' and 18, and forming a layer of photoresist material over said layer of conductive material;

optically exposing portions of said photoresist layer using stepper lithography to define within said photoresist layer images of portions of said semiconductor device other than selected portions of said second, third and fourth active regions;

exposing said portions of said semiconductor device other than said selected portions of said second, third and fourth active regions by removing said optically exposed portions of said photoresist layer, wherein said removing is accomplished by developing said photoresist layer; and anisotropically plasma etching said conductive material so as to form conductive lines on said second, third and fourth active regions.

2. A method for fabricating a bipolar semiconductor device in accordance with claim 1, wherein the step of forming said plurality of first type isolation regions is accomplished by the step of thermally oxidizing said exposed surface areas of said epitaxial layer to form thereon isolation regions comprised of silicon dioxide.

3. A method for fabricating a bipolar semiconductor device in accordance with claim 1, wherein the step of forming said second type isolation regions in said first epitaxial regions is accomplished by the step of introducing dopant impurities of said first conductivity type into said first epitaxial regions.

4. A method for fabricating a bipolar semiconductor device in accordance with claim 1, wherein said step of forming said second active region in said at least one second epitaxial region is accomplished by the step of implanting dopant ions of said first conductivity type into said second epitaxial region.

5. A method for fabricating a bipolar semiconductor device in accordance with claim 1, wherein said step of simultaneously forming said third active region and said fourth active region in said at least one second epitaxial region within said island of said epitaxial layer is accomplished by the step of implanting dopant ions of said second conductivity type into said at least one second epitaxial region within said island of said epitaxial layer.

6. A method for fabricating a bipolar semiconductor device in accordance with claim 1, wherein said semiconductor substrate of a first conductivity type comprises a p conductivity type silicon substrate, and said epitaxial layer comprises an n conductivity type silicon epitaxial layer.

7. A method for fabricating a bipolar semiconductor device in accordance with claim 1, wherein said masking layer is comprised of silicon nitride, and said buffer layer is comprised of silicon dioxide.

8. A method for fabricating a bipolar semiconductor device in accordance with claim 2, wherein the thickness of each said silicon dioxide isolation region is in the range of 6,000 to 10,000 Angstroms.

9. A method for fabricating a bipolar semiconductor device in accordance with claim 6, wherein said second active region comprises a p conductivity type region and wherein said first, third and fourth active regions comprise n conductivity type regions.

10. A method for fabricating a bipolar semiconductor device in accordance with claim 6, wherein said second type isolation regions of said first conductivity type comprise p conductivity type isolation regions.

11. A method for fabricating a bipolar semiconductor device in accordance with claim 10, wherein the depth of each of said p conductivity type isolation regions is in the range of 1 to 5 microns.

12. A method for fabricating a bipolar semiconductor device, said bipolar semiconductor device having a silicon substrate of a first conductivity type, a first active region of a second conductivity type formed in said silicon substrate of a first conductivity type, and an epitaxial layer of a second conductivity type formed over said silicon substrate and over said first active region, wherein said first active region functions as a buried collector region of said bipolar semiconductor device, said method comprising the steps of:

forming a buffer layer over said epitaxial layer;

forming a masking layer over said buffer layer;

optically exposing portions of a layer of photoresist material formed over said masking layer, wherein said optically exposing is accomplished using stepper lithography to define within said photoresist layer images for a plurality of surface areas of said epitaxial layer, and such that portions of said masking layer not optically exposed define at least one first region and at least one second region of said epitaxial layer;

eposing said plurality of surface areas of said epitaxial layer by removing portions of said masking layer underlying said portions of said photoresist layer which were optically exposed, wherein said removing is accomplished by selectively plasma etching said masking and buffer layers;

thermally oxidizing said selected portions of said epitaxial layer so as to form a plurality of isolation regions of a first type in said selected portions of said epitaxial layer, such that each of said exposed areas of said buffer layer is incorporated into one of said first type isolation regions, and wherein said first type isolation regions comprise silicon dioxide, and wherein said masking layer prevents said isolation regions from being formed on any portions of said epitaxial layer other than on selected portions of said epitaxial layer;

forming a first protective layer over said device except over portions of said masking layer and said buffer layer overlying said at least one second epitaxial region;

implanting impurities of said second conductivity type into said at least one second epitaxial region so as to form a second active region of said second conductivity type in said epitaxial layer, wherein said second active region functions as a sinker region of said bipolar semiconductor device, said sinker region extending from an upper surface of said epitaxial layer to such a depth that said sinker region intersects said buried collector region;

removing said first protective layer;

removing portions of said masking layer and said buffer layer over said at least one epitaxial layer;

introducing impurities of said first conductivity type into all of said first epitaxial regions so as to form second type isolation regions in said epitaxial layer, such that said second type isolation regions extend from an upper surface of said epitaxial layer to a depth greater than the depth of said epitaxial layer, and wherein at least one of said second type isolation regions defines the periphery of an island of said epitaxial layer in which third, fourth and fifth active regions are to be formed, and in which said sinker region is located;

forming a second protective layer using stepper lithography such that said second protective layer is formed over the semiconductor device except over portions of said masking layer and said buffer layer overlying first portions of said at least one second epitaxial region;

removing said portions of said masking layer overlying said first portions of said at least one second epitaxial region;

introducing impurities of said first conductivity type into said first portions of said at least one second epitaxial region so as to form first portions of said third active region of a first conductivity type in said epitaxial layer;

removing said second protective layer;

thermally oxidizing said semiconductor device to form at least one additional first type isolation region and so as to reform at least one previously formed first type isolation region;

removing said portions of said masking layer overlying said second and third portions of said at least one second epitaxial region;

introducing impurities of said first conductivity type into said second and third portions of said at least one second epitaxial region so as to form second and third portions of said third active region of a first conductivity type in said epitaxial layer, wherein said first, second and third portions of said third active region combine to form the third active region which has an upper surface coplanar with said epitaxial layer, and extends from said upper surface of said epitaxial layer to a depth less than the depth of said epitaxial layer, and wherein said third active region functions as a base region of said bipolar semiconductor device;

removing said third protective layer;

forming a fourth protective layer over the semiconductor device, except over a portion of said third active region, and except over a portion of said sinker region;

implanting impurities of said second conductivity type into said portions of said third active region and said sinker region so as to form said fourth and fifth active regions of said second conductivity type within said third active region and said sinker region, respectively, said fourth and fifth active regions each extending from the upper surface of said epitaxial layer to a depth less than the depths of said third active region and said sinker region, wherein said foruth and fifth active regions function as an emitter region and a collector contact region, respectively, of said bipolar semiconductor device;

removing said fourth protective layer;

removing any remaining portions of said buffer layer;

depositing a layer of conductive material over said device such that portions of said conductive material are deposited over said third, fourth and fifth active regions;

forming a fifth protective layer using stepper lithography such that said fifth protective layer is formed over selected portions of said layer of conductive material;

selectively anisotropically plasma etching portions of said layer of conductive material not covered by said foruth protective layer so as to form conductive interconnect lines for said third, fourth and fifth active regions;

removing said fifth protective layer.

13. A method for fabricating a bipolar semiconductor device in accordance with claim 12, wherein said semiconductor substrate of a first conductivity type comprises a p conductivity type silicon substrate and said epitaxial layer comprises an n conductivity type epitaxial layer.

14. A method for fabricating a bipolar semiconductor device in accordance with claim 12, wherein the thickness of each of said silicon dioxide isolation regions is in the range of 6,000 to 10,000 microns.

15. A method for fabricating a bipolar semiconductor device in accordance with claim 13, wherein said step of implanting impurities of said second conductivity type into said at least one second epitaxial region so as to form a second active region is accomplished by the step of implanting n conductivity type dopant ions into said at least one second epitaxial region so as to form an n conductivity type region which is to function as said sinker region of said bipolar semiconductor device.

16. A method for fabricating a bipolar semiconductor device in accordance with claim 13, wherein said step of introducing impurities of said first conductivity type into all of said first epitaxial regions so as to form second type isolation regions is accomplished by the step of diffusing p conductivity type dopant impurities into said first epitaxial regions.

17. A method for fabricating a bipolar semiconductor device in accordance with claim 13, wherein said step of introducing impurities of said first conductivity type into said at least one second epitaxial region so as to form said first, second and third portions of said third active region is accomplished by the step of introducing p conductivity type dopant impurities into said at least one second epitaxial region so as to form said third active region which is to function as said base region of said bipolar semiconductor device.

18. A method for fabricating a bipolar semiconductor device in accordance with claim 13, wherein said step of implanting impurities of said second conductivity type into said portions of said third active region and said sinker region so as to form said fourth and fifth active regions is accomplished by the step of implanting n conductivity type dopant ions into said third active region and into said sinker region so as to form said fourth and fifth active regions which are to function as an emitter region and a collector contact region, respectively, of said bipolar semiconductor device.

19. A method for fabricating a bipolar semiconductor device in accordance with claim 16, wherein the depth of each of said p conductivity type isolation regions is in the range of 1 to 5 microns.

20. A method for fabricating a bipolar semiconductor device, said device having a p-type silicon substrate, said method comprising:

forming a n-type buried collector layer in said substrate;

growing an n-type epitaxial layer over said substrate and over said buried collector layer;

thermally oxidizing said epitaxial layer to form a buffer layer of silicon dioxide on said epitaxial layer;

depositing a masking layer of silicon nitride over said buffer oxide layer;

optically exposing portions of a first layer of photoresist material formed over said masking layer, wherein said optically exposing is accomplished using stepper lithography to define within said photoresist layer images for selected portions of said epitaxial layer;

exposing said portions of said buffer layer overlying said selected portions of said epitaxial layer by removing portions of said masking layer underlying said porttions of said photoresist layer which were optically exposed, wherein said removing is accomplished by selectively plasma etching said masking layer;

thermally oxidizing said selected portions of said epitaxial layer to form thereon field oxide isolation regions, such that each of said exposed portions of said buffer layer is incorporated into one of said field oxide isolation regions;

forming an n-type sinker region by implanting ntype dopant ions through said masking and buffer layers into a selected region of the epitaxial layer to a depth sufficient to penetrate said buried collector region;

forming at least one p-type junction isolation region in at least one selected region of said epitaxial layer, wherein said junction isolation region is formed by introducing p-type impurities into said selected region of said epitaxial layer, such that said junction isolation region extends to a depth greater than the depth of said epitaxial layer, thus extending into said substrate;

optically exposing portions of a second layer of photoresist material formed over said masking layer, wherein said optically exposing is accomplished using stepper lithography to define within said photoresist layer images for a selected second portion of said epitaxial layer;

exposing said selected second portion of said epitaxial layer by removing portions of said masking layer underlying said portion of said photoresist layer which was optically exposed, wherein said removing is accomplished by selectively plasma etching said masking and buffer layers;

forming first p-type base regions in said epitaxial layer by introducing p-type impurities into said exposed second portions of said epitaxial layer;

thermally oxidizing said semiconductor device to form at least one additional silicon dioxide isolation region and so as to reform at least one previously formed silicon dioxide isolation region;

removing all remaining portions of said masking layer;

forming an n-type emitter region in a selected third portion of said epitaxial layer and in a portion of said sinker region by implanting n-type dopant ions into said selected third portion of said epitaxial layer, and into said portion of said sinker region;

forming said second and third p-type base regions in said epitaxial layer by implanting p-type dopant ions into selected regions of said epitaxial layer;

removing any remaining portions of said silicon dioxide buffer layer;

depositing a layer of conductive material over said semiconductor device in process;

forming a layer of photoresist material over said layer of conductive material, said layer of photoresist material having apertures defined by stepper lithography, which apertures expose portions of said layer of conductive material; and anisotropically plasma etching said layer of conductive material to create conductive lines which provide electrical connections to said base, emitter and buried collector regions.

\* \* \* \* \*